United States Patent
Yagi et al.

(10) Patent No.: US 8,188,010 B2
(45) Date of Patent: May 29, 2012

(54) COMPOSITE SUPERCONDUCTIVE WIRE-MATERIAL, MANUFACTURING METHOD OF COMPOSITE SUPERCONDUCTIVE WIRE-MATERIAL, AND SUPERCONDUCTIVE CABLE

(75) Inventors: Masashi Yagi, Tokyo (JP); Hirao Hirata, Tokyo (JP); Shinichi Mukoyama, Tokyo (JP); Yuh Shiohara, Tokyo (JP)

(73) Assignees: The Furukawa Electric Co., Ltd., Tokyo (JP); International Superconductivity Center, The Juridical Foundation, Tokyo (JP)

( * ) Notice: Subject to any disclaimer, the term of this patent is extended or adjusted under 35 U.S.C. 154(b) by 519 days.

(21) Appl. No.: 12/364,332

(22) Filed: Feb. 2, 2009

(65) Prior Publication Data

US 2009/0233799 A1 Sep. 17, 2009

Related U.S. Application Data (60) Provisional application No. PCT/JP2007/064594, filed on Jul. 25, 2007.

(30) Foreign Application Priority Data

Aug. 2, 2006 (JP) .................. 2006-211343

(51) Int. Cl.
*H01B 12/06* (2006.01)
*H01B 13/00* (2006.01)
*H01F 6/06* (2006.01)

(52) U.S. Cl. ........ 505/434; 505/430; 505/470; 505/237; 505/704; 505/927; 174/125.1; 29/599; 228/259; 228/262.5; 228/262.6; 428/457; 428/646; 428/648; 148/528

(58) Field of Classification Search .................. 505/230, 505/237, 430, 434, 437, 472, 704, 705, 887; 174/125.1; 29/599; 228/259
See application file for complete search history.

(56) References Cited

U.S. PATENT DOCUMENTS

| | | | |
|---|---|---|---|
| 5,239,157 A | 8/1993 | Sakano et al. | |
| 5,299,728 A | 4/1994 | King et al. | |
| 5,347,242 A | 9/1994 | Shimano et al. | |
| 6,417,458 B1 | 7/2002 | Mukoyama et al. | |
| 6,762,673 B1 * | 7/2004 | Otto et al. | 338/32 S |
| 7,301,323 B2 | 11/2007 | Ichikawa et al. | |
| 7,781,376 B2 * | 8/2010 | Kodenkandath et al. | 505/235 |
| 2004/0266628 A1 * | 12/2004 | Lee et al. | 505/238 |
| 2008/0202127 A1 | 8/2008 | Mukoyama et al. | |

FOREIGN PATENT DOCUMENTS

| | | |
|---|---|---|
| JP | 4-106809 | 4/1992 |
| JP | 6-203671 | 7/1994 |
| JP | 7-73758 | 3/1995 |
| JP | 7-335051 | 12/1995 |
| JP | 2001-25891 | 1/2001 |
| JP | 2001-025891 | * 1/2001 |
| WO | WO 2006/120291 | * 11/2006 |

OTHER PUBLICATIONS

U.S. Appl. No. 12/358,916, filed Jan. 23, 2009, Yagi, et al.

* cited by examiner

*Primary Examiner* — Stanley Silverman
*Assistant Examiner* — Kallambella Vijayakumar
(74) *Attorney, Agent, or Firm* — Oblon, Spivak, McClelland, Maier & Neustadt, L.L.P.

(57) ABSTRACT

A thin film superconductive wire material (16) and an electro conductive tape (15) are immersed in a solder bath (35) containing a solder, which includes Sn(tin) and Bi (bismuth), to bond the thin film superconductive wire material (16) and the electro conductive tape (15) and a composite superconductive wire material (10) is formed.

3 Claims, 4 Drawing Sheets

COMPOSITE SUPERCONDUCTIVE WIRE-MATERIAL, MANUFACTURING METHOD OF COMPOSITE SUPERCONDUCTIVE WIRE-MATERIAL, AND SUPERCONDUCTIVE CABLE

TECHNICAL FIELD

The present invention relates to: a composite superconductive wire-material including a superconductive wire-material combined with an electroconductive tape; a manufacturing method of a composite superconductive wire-material; and a superconductive cable adopting the composite superconductive wire-material.

BACKGROUND ART

Wire-materials of high-temperature superconductive cables are known as a Bi-based silver sheath wire-material, and a thin-film superconductive wire-material (a coated conductor). Further, representatively thin-film superconductive wire-materials are known as Y-based superconductive wire-materials (hereinafter called "Y-based wire-materials"). Bi-based silver sheath wire-materials have been problematic, due to rapid decrease of critical current densities upon application of external magnetic fields. Meanwhile, Y-based wire-materials are resistant to external magnetic fields and are capable of keeping higher current densities even within strong magnetic fields, so that the Y-based wire-materials are expected for application to AC power equipments such as superconductive cables.

To stably use the Y-based wire-materials in power equipments, these wire-materials are required to have structures capable of withstanding over-currents even upon accidents. As such, it has been required to form a silver layer as a stabilizing layer on a superconductive layer, and to combine an electroconductive tape onto the silver layer, thereby causing them to share an accidental current.

As a technique for combining an electroconductive tape with a thin-film superconductive wire-material, the Patent Document 1 has proposed a fabricating apparatus and a fabricating method of superconductive tape suitable for usage in a superconductive magnet and a superconductive switch, in a manner to interpose a superconductive tape between two electroconductive tapes, and to pass them through a molten solder bath under application of a controlled pressure, to form a laminated tape.

Patent Document 1: Japanese Patent Application Laid-Open Publication No. 1994-203671

DISCLOSURE OF INVENTION

Problem to be Solved by the Invention

As described above, Y-based wire-materials typically have sputtered silver or the like as stabilizing layers, and the layers each have a mere thickness within a range of several microns to several tens of microns. As such, excessive application of heat upon soldering causes the stabilizing layer comprising silver to be eroded by solder to expose a superconductive layer, thereby resulting in a problem of deteriorated superconductive properties.

Erosion of the stabilizing layer by solder fails to obtain a sufficient bonding strength, thereby resulting in another problem of separation between the substances to be bonded to each other. Meanwhile, usage of lead is undesirable from an environmental standpoint and thus legally restricted, thereby exhibiting a different problem that usage of solder including lead will be inhibited in the near future.

Thus, the present invention has been carried out to solve the above problems, and aims at providing: a composite superconductive wire-material which can be formed of a thin-film superconductive wire-material and an electroconductive tape bonded thereto, by immersing the thin-film superconductive wire-material and electroconductive tape into and through a solder bath adopting a lead (Pb)-free solder, a manufacturing method of the composite superconductive wire-material, and a superconductive cable.

Means for Solving Problem

The present inventors have earnestly and repeatedly investigated the conventional problems as discussed above. As a result, it has been proven that a composite superconductive wire-material formed of a thin-film superconductive wire-material and an electroconductive tape bonded to each other can be stably fabricated by immersing the thin-film superconductive wire-material and electroconductive tape into and through a solder bath, which bath adopts a solder comprising an Sn (tin)-based alloy including Bi (bismuth) and which bath is set at an immersion temperature between 160° C. and 200° C.

The present invention provides a first configuration of a composite superconductive wire-material comprising:
a thin-film superconductive wire-material including: a substrate; a superconductive layer; and a stabilizing layer; arranged in this order; and
an electroconductive tape material formed on the stabilizing layer, with a lead-free solder which is interposed therebetween and which includes at least Sn and Bi.

Note that, although the superconductive layer is required to be formed after formation of the intermediate layer on the substrate depending on the kind of the substrate, the intermediate layer is not necessarily formed since the intermediate layer is provided to simply avoid such a phenomenon that the substrate and the superconductive layer are mutually diffused to deviate a composition of the superconductive thin-film from a stoichiometric composition. Further, the lead-free solder in the present invention refers to: an Sn—Bi solder in case of a binary system; and an alloy solder comprising (i) a metal(s) other than Pb, (ii) Sn, and (iii) Bi, in case of a ternary or higher system.

The present invention provides a second configuration of the composite superconductive wire-material according to the first configuration of the composite superconductive wire-material of the present invention, characterized in that the solder includes Bi at a content of 55 to 60 wt %.

The present invention provides a third configuration of the composite superconductive wire-material according to the second configuration of the composite superconductive wire-material, characterized in that the solder includes 0.5 to 1 wt % of Ag.

The present invention provides a first configuration of a manufacturing method of a composite superconductive wire-material, characterized in that the method comprises the steps of:
preparing a thin-film superconductive wire-material including: a substrate; a superconductive layer; and a stabilizing layer; arranged in this order;
abutting the thin-film superconductive wire-material and the electroconductive tape to each other;
immersing at least a part of an abutment area, the abutment area comprising the thin-film superconductive wire-material and the electroconductive tape abutted to each other, into a molten solder in a solder bath to bond the thin-film superconductive wire-material and the electroconductive tape to each other, thereby forming a composite superconductive wire-material bondedly formed by the solder; and transporting the composite superconductive wire-material to the outside of the solder bath; and that the solder is a lead-free solder comprising at least Sn and Bi.

The present invention provides a second configuration of the manufacturing method of a composite superconductive wire-material according to the first configuration of the manufacturing method of a composite superconductive wire-material of the present invention, characterized in that at least the part of the abutment area is immersed into the solder at an immersion temperature between 160° C. and 200° C.; and that the immersion temperature has a relationship with an immersion time, during which at least the part of the abutment area is immersed into the solder, as follows:

immersion temperature≧(−10/3)×immersion time+ 210 (where 3 sec≦immersion time≦15 sec), and immersion temperature≦(−4/3)×immersion time+280 (where 60 sec≦immersion time≦90 sec).

The present invention provides a third configuration of the manufacturing method of a composite superconductive wire-material according to the first or second configuration of the manufacturing method of a composite superconductive wire-material of the present invention, characterized in that the solder includes Bi at a content of 55 to 60%.

The present invention provides a fourth configuration of the manufacturing method of a composite superconductive wire-material according to the third configuration of the manufacturing method of a composite superconductive wire-material of the present invention, characterized in that the solder includes 0.5 to 1 wt % of Ag.

The present invention provides a first configuration of a superconductive cable, comprising:

a cylindrical body;

the above-described composite superconductive wire-material;

an electrically insulative layer arranged around an outer periphery of the composite superconductive wire-material;

a protective layer arranged outside the electrically insulative layer; and a heat insulation tube arranged outside the protective layer.

Effect of the Invention

According to the present invention, it is possible to fabricate a stabilized composite superconductive wire-material by virtue of absence of erosion of its stabilizing layer by solder. Namely, it is possible to fabricate a composite superconductive wire-material having a higher quality. Further, usage of a lead-free solder allows for provision of a manufacturing process and a product in an environmentally safe nature.

| EXPLANATIONS OF LETTERS OR NUMERALS | |
|---|---|
| 10 | composite superconductive wire-material |
| 11 | substrate |
| 12 | intermediate layer |
| 13 | superconductive layer |
| 14 | stabilizing layer (silver) |
| 15 | electroconductive tape |
| 16 | thin-film superconductive wire-material (coated conductor) |
| 21, 22 | feed spool |
| 23 | take-up spool |
| 24, 25, 28 | idle pulley |
| 26, 27 | pulley |
| 35 | solder bath |
| 40 | superconductive cable |
| 41 | cylindrical body (former) |
| 42 | electrically insulative layer |
| 43 | protective layer |
| 44 | inner tube |
| 45 | heat insulator |
| 46 | outer tube |
| 47 | superconductive shielding layer |

BEST MODE(S) FOR CARRYING OUT THE INVENTION

Embodiments of the present invention will be described with reference to the drawings. Note that the embodiments are provided for explanation, and are not intended to limit the scope of the present invention. Thus, those skilled in the art would be able to adopt variants including equivalent elements instead of some or all of the elements of the embodiments, and such variants are also embraced within the scope of the present invention.

Figure 1:
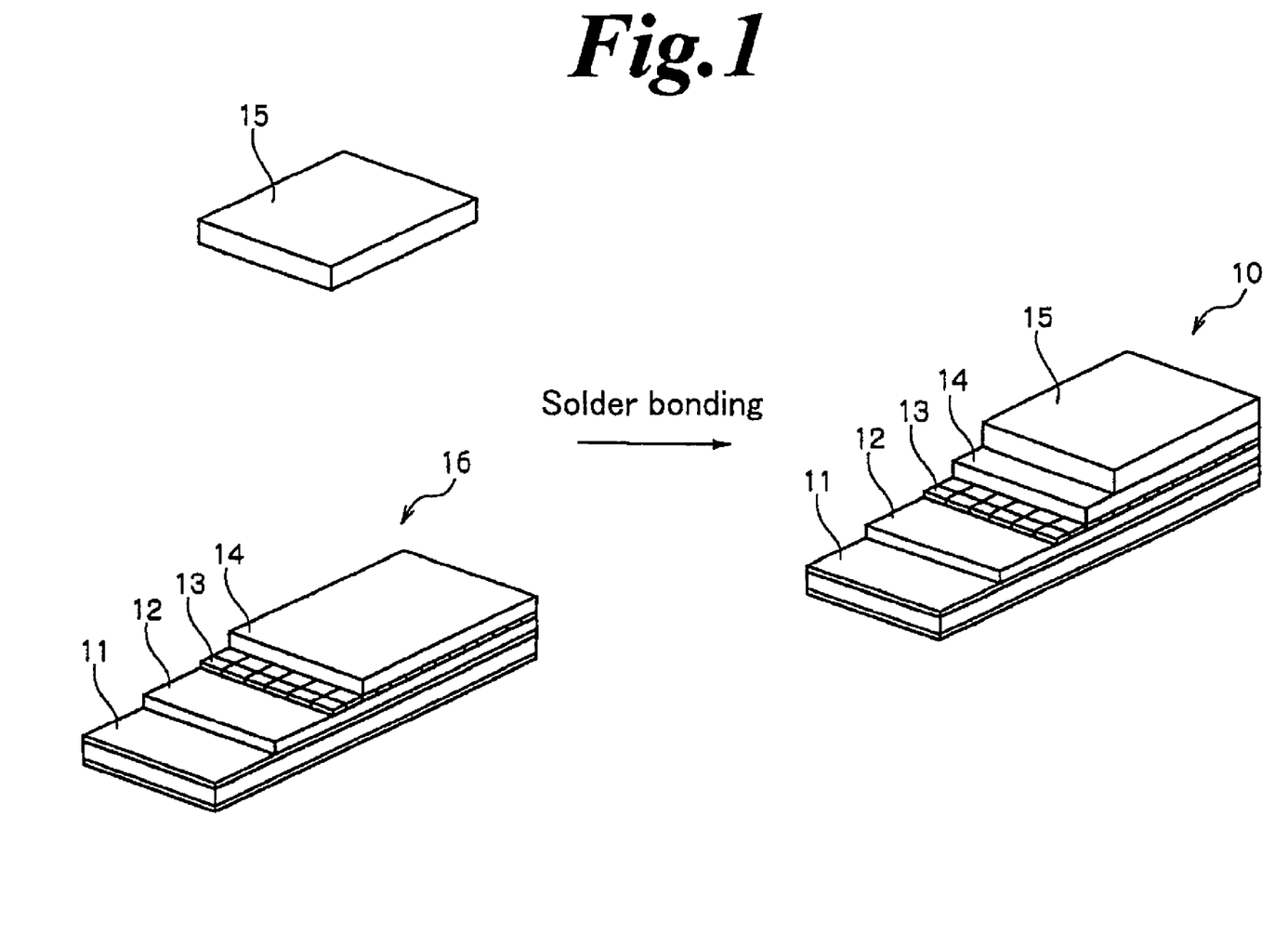
FIG. 1 is a perspective cross-sectional view of an embodiment of a composite superconductive wire-material according to the present invention.

FIG. 1 is a perspective cross-sectional view of an embodiment of a composite superconductive wire-material according to the present invention. As shown in FIG. 1, the thin-film superconductive wire-material 16 includes an intermediate layer 12 formed on a substrate 11, a superconductive layer 13 formed on the intermediate layer 12, and a stabilizing layer (silver) 14 formed on the superconductive layer 13.

The composite superconductive wire-material 10 is formed by soldering the stabilizing layer (silver) 14 of the thin-film superconductive wire-material 16 to an electroconductive tape 15. Although not shown in FIG. 1, there exists a solder layer comprising a lead-free solder between the stabilizing layer 14 and electroconductive tape 15, and the electroconductive tape 15 is bondedly formed on the stabilizing layer (silver) 14 of the thin-film superconductive wire-material 16 through the solder layer.

Figure 2:
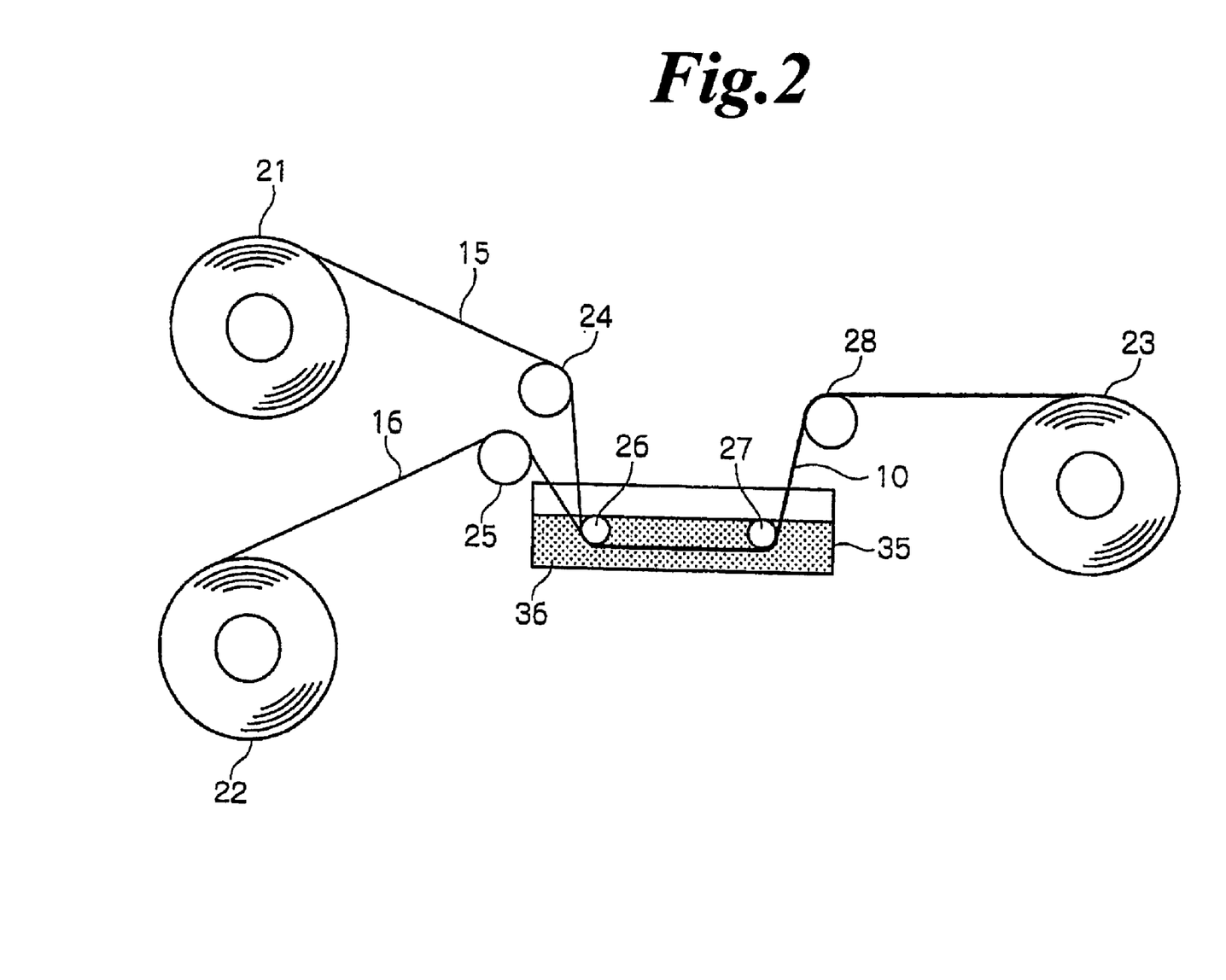
FIG. 2 is a conceptional view for explaining an embodiment of a manufacturing method of the composite superconductive wire-material according to the present invention.

FIG. 2 is a conceptional view for explaining an embodiment of a manufacturing method of the composite superconductive wire-material according to the present invention. As shown in FIG. 2, the electroconductive tape 15 fed from a feed spool 21 is transferred to a pulley 26 through an idle pulley 24, and then transferred to a pulley 27 through the pulley 26.

Further, the thin-film superconductive wire-material 16 fed from a feed spool 22 is transferred to the pulley 26 through an idle pulley 25, and then transferred to the pulley 27 through the pulley 26. At this time, the thin-film superconductive wire-material 16 and electroconductive tape 15 are transferred at the same speed in a manner abutted to each other between the pulley 26 and pulley 27. Here, the cooperative area of the thin-film superconductive wire-material 16 and electroconductive tape 15, where the thin-film superconductive wire-material 16 and electroconductive tape 15 are abutted to each other between the pulley 26 and pulley 27, is called an "abutment area".

The present apparatus is provided with a solder bath 35 installed to immerse the abutment area into the molten solder 36. The composite superconductive wire-material 10, obtained by immersing the abutment area into the molten solder 36 to laminatingly bond the thin-film superconductive wire-material 16 and electroconductive tape 15 to each other, is taken up by a take-up spool 23 through an idle pulley 28. That longitudinal distance of the abutment area, which is immersed at this time, is regarded as an immersion distance.

Further, the time (hereinafter called "immersion time"), during which the abutment area is immersed in the molten solder 36, is adjusted by controlling feeding rotation speeds of the feed spools 21, 22, the take-up rotation speed of the take-up spool 23, and the immersion distance.

Here, the immersion temperature of the solder bath 35 is set at 160 to 200° C. Further, used as the solder 36 is a lead-free solder comprising at least Sn and Bi.

According to the above-mentioned method, the stabilizing layer 14 made of silver and even having a thickness of 5 to 10 μm through sputtering or the like is not eroded by the solder 36 such that the superconductive layer 13 is not exposed, thereby allowing for fabrication of the composite superconductive wire-material 10 which is free of degradation of superconductive properties and is thus stabilized. Namely, it is possible to fabricate the composite superconductive wire-material 10 having an excellent quality. Further, usage of the lead-free solder 36 allows for provision of a manufacturing process and a product in an environmentally desirable manner.

Figure 3:
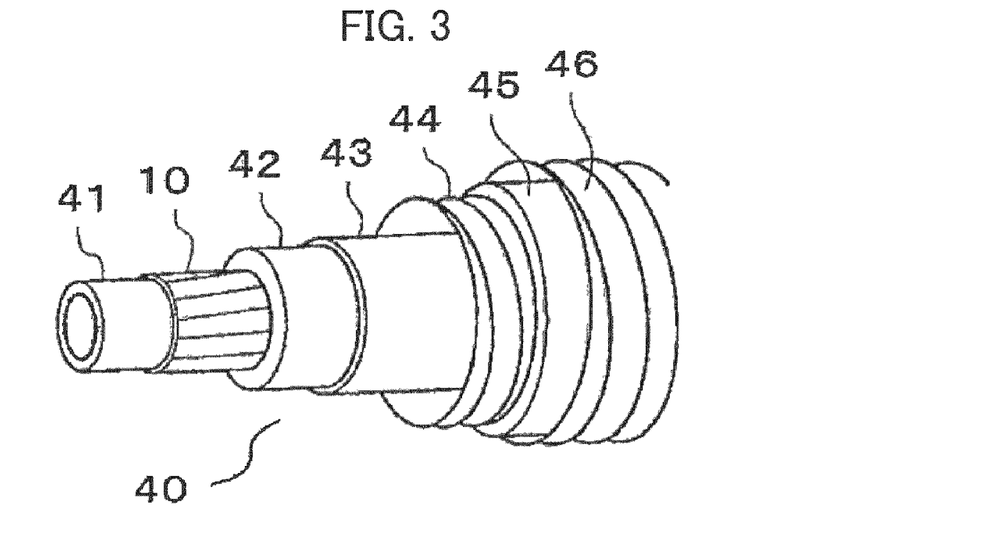
FIG. 3 is a perspective view of an embodiment of a superconductive cable according to the present invention.

FIG. 3 is a perspective view of an embodiment of a superconductive cable according to the present invention. The superconductive cable 40 comprises: a cylindrical body 41 (former) made of metal (e.g., made of copper); a superconductive wire-material 10 helically wound therearound; an electrically insulative layer 42 (the material of which is paper or semisynthetic paper) thereon; a subsequent protective layer 43 (such as made of electroconductive paper or woven copper wires); and a heat insulative double tube made of flexible metal (e.g., made of stainless or aluminum) for housing therein the cable core constituted of the above-described elements, i.e., the heat insulative double tube being made of an inner tube 44, an outer tube 46, and a heat insulator 45 arranged between the inner tube 44 and outer tube 46.

Figure 4:
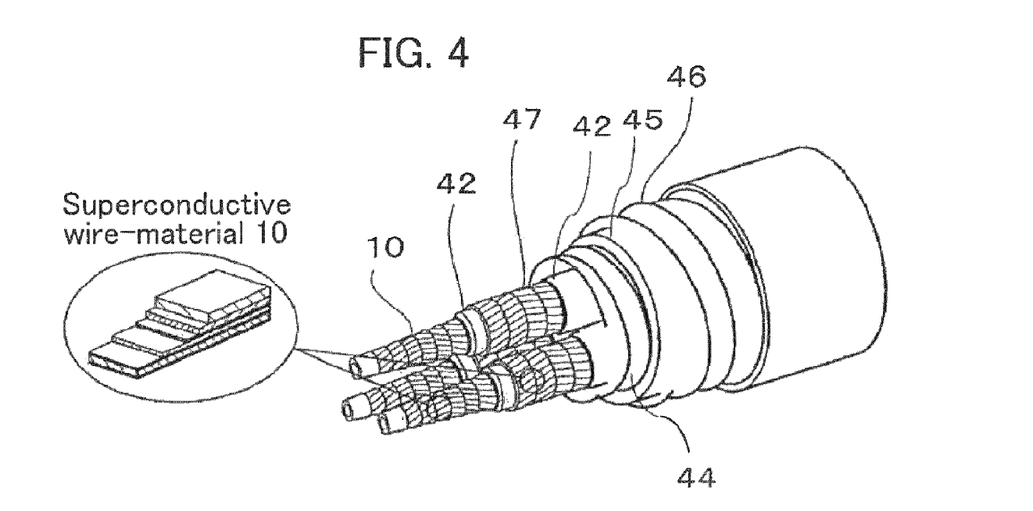
FIG. 4 is a perspective view of another embodiment of a superconductive cable according to the present invention.

FIG. 4 is a perspective view of another embodiment of a superconductive cable according to the present invention. The superconductive cable shown in FIG. 4 is structured to comprise: cylindrical bodies 41 made of metal (e.g., made of copper); superconductive wire-materials 10 helically wound therearound, respectively; electrically insulative layers 42 (the material of which is paper or semisynthetic paper) thereon, respectively; subsequent superconductive shielding layers 47 thereon, respectively; protective layers 43 (such as made of electroconductive paper or woven copper wires) thereon, respectively; and a heat insulative double tube made of flexible metal (e.g., made of stainless or aluminum) for housing therein the cable core constituted of the above-described elements. The heat insulative double tube comprises an inner tube 44, an outer tube 46, and a heat insulator 45 arranged between the inner tube 44 and outer tube 46. It is possible to provide an anticorrosive layer, outside the heat insulative double tube. Here, although the electrical conductor constituting the superconductive shielding layers 47 is not particularly limited, it is desirable to use the same superconductive wire-material as the superconductive wire-material 10. Although the cable shown in FIG. 3 has no superconductive shielding layers, it is desirable for the cable to have a superconductive shielding layer 47 similarly to those in FIG. 4. Provision of a superconductive shielding layer 47 enables formation of a superconductive cable 40 which exhibits an extremely low degree of leakage magnetic field.

There will be explained preferred embodiments of the present invention.

Embodiment 1

Using Sn-58Bi (liquid phase line temperature: 139° C.) comprising an Sn-based alloy including 58% of Bi as the solder 36, the electroconductive tape 15 and thin-film superconductive wire-material 16 were combined with each other as shown in FIG. 2. Concretely, the electroconductive tape 15 fed from the feed spool 21 was transferred to the pulley 26 through the idle pulley 24, and then transferred to the pulley 27 through the pulley 26. Further, the thin-film superconductive wire-material 16 fed from the feed spool 22 was transferred to the pulley 26 through the idle pulley 25, and then transferred to the pulley 27 through the pulley 26. At this time, the electroconductive tape 15 and the thin-film superconductive wire-material 16 were transferred at the same speed. Further, the solder bath 35 was so installed that the abutment area, where the thin-film superconductive wire-material 16 and electroconductive tape 15 were abutted to each other between the pulley 26 and pulley 27, was immersed into the molten solder 36. The abutment area of the thin-film superconductive wire-material 16 and electroconductive tape 15 was immersed into the molten solder 36 in the solder bath 35 to laminate the thin-film superconductive wire-material 16 and electroconductive tape 15 to each other via solder 36 therebetween, to form the composite superconductive wire-material 10. Thereafter, the composite superconductive wire-material 10 was taken up by the take-up spool 23, through the idle pulley 28. Setting of tensions of the thin-film superconductive wire-material 16, electroconductive tape 15 and composite superconductive wire-material 10 at this time was conducted by torque control, to such a degree that the thin-film superconductive wire-material 16, electroconductive tape 15, and composite superconductive wire-material 10 were not slackened even when feeding and taking up diameters of the feed spool 21 and take-up spool 23 were changed.

As shown in FIG. 1, the thin-film superconductive wire-material 16 used here included the substrate 11 (hastelloy), the intermediate layer 12 ($CeO_2$) formed thereon, the superconductive layer 13 (YBCO) formed thereon, and the stabilizing layer (silver) 14 formed thereon. Note that the used thin-film superconductive wire-material 16 had a width of 10 mm, and the thicknesses of the layers were 100 μm for the substrate 11, 1 μm for the intermediate layer 12, 1 μm for the superconductive layer 13, and 10 μm for the stabilizing layer 14. Further, used as the electroconductive tape 15 was a tape made of oxygen-free copper and having a thickness of 100 μm.

Under the above conditions, there were observed a critical current (Ic), a solder bonding state, and an external appearance for each case, where the immersion temperature of the solder bath 35 was set at 200° C. or 160° C. while changing the immersion time from 1 second to 100 seconds. The results thereof are listed in Table 1. Note that the immersion distance for electroconductive tape 15 and thin-film superconductive wire-material 16 in this embodiment was set at 250 mm, and the immersion time of the electroconductive tape 15 and thin-film superconductive wire-material 16 was set by changing the feeding speeds thereof. Further, Ic's of pieces of thin-film superconductive wire-material 16 before achievement of solder immersion were all 100A.

TABLE 1

| Immersion temperature | | Immersion time (sec) | | | | | | | |
|---|---|---|---|---|---|---|---|---|---|
| | | 1 | 3 | 15 | 45 | 60 | 75 | 90 | 100 |
| 200° C. | Ic (A) original | 100 | 100 | 100 | 100 | 100 | 100 | 100 | 100 |
| | Ic (A) after combination | 100 | 100 | 100 | 100 | 100 | 98 | 90 | 85 |
| | Degradation ratio | 0 | 0 | 0 | 0 | 0 | 2% | 10% | 15% |
| | Solder bonding state | X | ○ | ○ | ○ | ○ | ○ | ○ | ○ |
| | External appearance | X | ○ | ○ | ○ | ○ | ○ | ○ | X |
| 160° C. | Ic (A) original | 100 | 100 | 100 | 100 | 100 | 100 | 100 | 100 |
| | Ic (A) after combination | 100 | 100 | 100 | 100 | 100 | 100 | 100 | 98 |
| | Degradation ratio | 0 | 0 | 0 | 0 | 0 | 0 | 0 | 2% |
| | Solder bonding state | X | X | ○ | ○ | ○ | ○ | ○ | ○ |
| | External appearance | X | X | ○ | ○ | ○ | ○ | ○ | ○ |

Namely, there were measured Ic's of composite superconductive wire-materials 10 at the respective immersion times changed from 1 second to 100 seconds where the immersion temperatures of the pieces of thin-film superconductive wire-material 16 and electroconductive tape in the solder bath 35 were 200° C. and 160° C. As a result, Ic's measured for immersion times longer than 75 seconds and at the immersion temperature of 200° C., had values lower than that of the thin-film superconductive wire-material 16 before achievement of solder immersion. Degradation ratios of Ic's of composite superconductive wire-materials 10 with respect to the Ic of the thin-film superconductive wire-material 16 before achievement of solder immersion, were 2% at the immersion temperature of 75 seconds, 10% at 90 seconds, and 15% at 100 seconds, thereby exemplifying that longer immersion times exceeding 75 seconds resulted in worse degradation ratios. Similarly, at the immersion temperature of 160° C., the degradation ratio of Ic of the applicable composite superconductive wire-material 10 with respect to the Ic of the thin-film superconductive wire-material 16 before achievement of solder immersion was 2% for the immersion time of 100 seconds or longer; and, although not listed in Table 1, longer immersion times exceeding 100 seconds resulted in worse degradation ratios.

There were also observed solder bonding states of pieces of thin-film superconductive wire-material 16 and electroconductive tape 15, and external appearances of composite superconductive wire-materials 10, where the immersion temperatures of the pieces of thin-film superconductive wire-material 16 and electroconductive tape 15 in the solder bath 35 were 200° C. and 160° C. while changing immersion times from 1 second to 100 seconds. Solder bonding states were evaluated by peeling once bonded electroconductive tapes, respectively. In Table 2, solder bonding states marked "x" indicate such states that bonding states were non-uniform where bonded portions were mottled or solders were not properly coated on bonded surfaces, while solder bonding states marked "○" indicate such states that coated states of solder at peeled surfaces were uniform. As a result, solder adherence at the immersion temperature of 200° C. was insufficient when the thin-film superconductive wire-material 16 and electroconductive tape 15 were immersed for an immersion time of 1 second, while adherences were made optimum for immersion times of 3 seconds and longer. Similarly, solder adherences at the immersion temperature of 160° C. were insufficient when the pieces of thin-film superconductive wire-material 16 and electroconductive tape 15 were immersed for immersion times of 3 seconds or shorter, while adherences were made optimum for immersion times of 15 seconds and longer.

Further, external appearances of composite superconductive wire-materials 10 were judged by visual inspection, and those states marked "x" in Table 2 indicate such states that surfaces of electroconductive tapes were not smooth and glossy, and those states marked "○" indicate such states that surfaces were smooth and glossy. At the immersion temperature of 200° C., the external appearance was undesirable when the thin-film superconductive wire-material 16 and electroconductive tape 15 were immersed for the immersion time of 1 second, while excellent external appearances were obtained by immersion times of 3 seconds and longer, similarly to the solder bonding states. Further, the immersion time of 100 seconds resulted in separation of an end of a stabilizing layer 14 to expose a superconductive layer 13. In turn, at the immersion temperature of 160° C., external appearances were undesirable when pieces of thin-film superconductive wire-material 16 and electroconductive tape 15 were immersed for immersion times of 3 seconds and shorter, respectively, while external appearances were made excellent by immersion times of 15 seconds and longer.

As described above, at the immersion temperature of 200° C. and in a time range of 3 to 60 seconds, it was possible to obtain composite superconductive wire-materials 10 exhibiting no degradations for superconductive properties (critical currents) and having stable solder bonding states and excellent external appearances, respectively, while at the immersion temperature of 160° C. and in a time range of 15 to 90 seconds, it was possible to obtain composite superconductive wire-materials 10 exhibiting no degradations for superconductive properties (critical currents) and having stable solder bonding states and excellent external appearances, respectively.

Note that Ic values were evaluated here, by cutting out test pieces of 10 cm length from completed composite superconductive wire-materials 10, respectively, followed by a direct current four-terminal method in liquid nitrogen. The Ic at this time was defined to be 1 µV/cm. Further, the immersion temperatures here were those of solder 36 within the solder bath 35, respectively, as measured by a thermocouple.

Embodiment 2

Next, there were observed critical currents (Ic), solder bonding states, and external appearances, when the immersion temperature of the solder bath 35 was changed from 155° C. to 210° C. Used as a solder 36 in this embodiment was Sn-58Bi (liquid phase line temperature: 139° C.) comprising an Sn-based alloy including 58% of Bi, and pieces of electroconductive tape 15 and thin-film superconductive wire-material 16 were combined as shown in FIG. 2, respectively. Note that the combining manner, conditions of combination, and configurations of the pieces of thin-film superconductive wire-material 16 and electroconductive tape 15 were the same as those in Embodiment 1. The results thereof are listed in Table 2. Further, in this embodiment, feeding speeds of electroconductive tape 15 and thin-film superconductive wire-material 16 were set at 1 m/min, respectively, and the immersion distance was set at 250 mm, thereby achieving an immersion time of 15 seconds. Ic's of the pieces of thin-film superconductive wire-material 16 before achievement of solder immersion were all 100A.

Ic's of composite superconductive wire-materials 10 at the respective immersion temperatures were measured, by changing immersion temperatures for pieces of thin-film superconductive wire-material 16 and electroconductive tape 15 in the solder bath 35 from 155° C. to 210° C. As a result, Ic's had values smaller than that of thin-film superconductive wire-material 16 before achievement of solder immersion, in case of the immersion temperatures of 205° C. and 210° C. exceeding 200° C. Degradation ratios of Ic's of composite superconductive wire-materials 10 with respect to the Ic of the thin-film superconductive wire-material 16 before achievement of solder immersion, were 2% at 205° C. and 10% at 210° C., thereby exemplifying that immersion temperatures exceeding 200° C. resulted in worse degradation ratios. There were also observed solder bonding states of the pieces of thin-film superconductive wire-material 16 and electroconductive tape 15, and external appearances of composite superconductive wire-materials 10, where the immersion temperatures of the pieces of thin-film superconductive wire-material 16 and electroconductive tape 15 in the solder bath 35 were changed from 155 to 210° C. The manner for confirming solder bonding states was the same as Embodiment 1, and also the states marked "x" and "○" in Table 2 are the same as those in Embodiment 1. As listed in Table 2, solder adherence was undesirable when pieces of thin-film superconductive wire-material 16 and electroconductive tape 15 were immersed at the temperature of 155° C. lower than 160° C., while adherences were made optimum at immersion temperatures of 195 to 200° C. The manner for confirming external appearances of composite superconductive wire-materials 10 was the same as Embodiment 1, and also the states marked "x" and "○" in Table 2 are the same as those in Embodiment 1. As listed in Table 2, external appearance of the applicable composite superconductive wire-material 10 was undesirable when pieces of thin-film superconductive wire-material 16 and electroconductive tape 15 were immersed at the temperature of 155° C. lower than 160° C., while external appearances were excellent at immersion temperatures of 160° C. and higher. Further, immersion temperatures of 210° C. or higher resulted in separation of an end of a stabilizing layer 14 to expose a superconductive layer 13.

As described above, at the immersion time of 15 seconds and in the temperature range of 160 to 200° C., it was possible to obtain composite superconductive wire-materials 10 exhibiting no degradations for superconductive properties (critical currents) and having stable solder bonding states and excellent external appearances, respectively. Meanwhile, the same results were obtained as Table 2, when the immersion time was set at 60 seconds.

Figure 5:
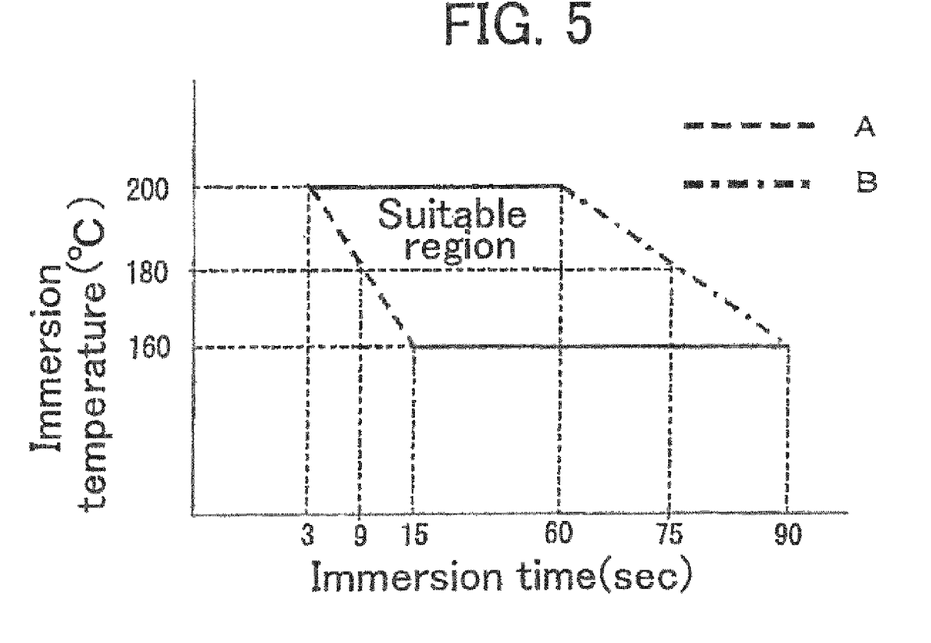
FIG. 5 is a graph of an optimum region in terms of an immersion temperature and an immersion time for a solder of the present invention.

Based on the results of Embodiment 1 and Embodiment 2, the optimum region of solder 36 of the present invention is defined in relation to an immersion temperature and an

TABLE 2

| | Immersion temperature (° C.) | | | | | | | |
|---|---|---|---|---|---|---|---|---|
| | 155 | 160 | 165 | 180 | 195 | 200 | 205 | 210 |
| Ic (A) | 100 | 100 | 100 | 100 | 100 | 100 | 98 | 90 |
| Ic degradation ratio | 0 | 0 | 0 | 0 | 0 | 0 | 2% | 10% |
| Solder bonding state | X | ○ | ○ | ○ | ○ | ○ | ○ | ○ |
| External appearance | X | ○ | ○ | ○ | ○ | ○ | ○ | X | immersion time as shown in FIG. 5. FIG. 5 is a graph having an ordinate representing an immersion temperature of the solder bath 35, and an abscissa representing an immersion time of electroconductive tape 15 and thin-film superconductive wire-material 16. It was observed from Embodiment 1 that, when the immersion times were from 3 to 15 seconds, immersion times suitable for solder bonding states and external appearances at the immersion temperatures of 160° C. and 200° C. were different from each other. Thus, there was supposed an optimum region of solder 36 by means of a linear function, so as to conduct an approximation for the optimum region from two points comprising the immersion time of 3 seconds at the immersion temperature of 200° C. and the immersion time of 15 seconds at the immersion time of 160° C. The linear function at this time was, "immersion temperature=(−10/3)×immersion time+210". The linear function at this time is designated as "A" which is represented by a broken line A in FIG. 5, and it is possible to assume that the region represented by "immersion temperature≦(−10/3)× immersion time+210" is defined as the optimum region for the immersion times of 3 to 15 seconds. Similarly, there was supposed an optimum region of solder 36 by means of a linear function, so as to conduct an approximation for the optimum region from two points comprising the immersion time of 60 seconds at the immersion temperature of 200° C. and the immersion time of 90 seconds at the immersion temperature of 160° C., and the linear function at this time was, "immersion temperature=(−4/3)×immersion time+280". The linear function at this time is designated as "B" which is represented by a dashed line B in FIG. 5, and it is possible to assume that the region represented by "immersion temperature≦(−4/3)× immersion time+280" is defined as the optimum region for the immersion times of 60 to 90 seconds.

Embodiment 3

Based on the above assumption of the optimum region, there were observed critical currents (Ic), solder bonding states, and external appearances, while the immersion times were changed from 1 to 100 seconds at the immersion temperature of 180° C. Used as a solder 36 in this embodiment was Sn-58Bi (liquid phase line temperature: 139° C.) comprising an Sn-based alloy including 58% of Bi, and pieces of electroconductive tape 15 and thin-film superconductive wire-material 16 were combined as shown in FIG. 2, respectively. Note that the combining manner, conditions of combination, and configurations of the pieces of thin-film superconductive wire-material 16 and electroconductive tape 15 were the same as those in Embodiment 1. The results thereof are listed in Table 3. In this embodiment, the immersion distance for electroconductive tape 15 and thin-film superconductive wire-material 16 was set at 250 mm, respectively, while setting immersion times of the pieces of electroconductive tape 15 and thin-film superconductive wire-material 16 by changing feeding speeds thereof, respectively. Ic's of the pieces of thin-film superconductive wire-material 16 before achievement of solder immersion were all 100A.

There were measured Ic's of composite superconductive wire-materials 10 at the immersion temperature of 180° C. of pieces of thin-film superconductive wire-material 16 and electroconductive tape 15 in the solder bath 35, at respective immersion times changed from 1 to 100 seconds. As a result, Ic's for immersion times of 90 seconds and longer had values smaller than Ic of thin-film superconductive wire-material 16 before achievement of solder immersion, and superconductive properties were excellent for immersion times of 75 seconds and shorter. Degradation ratios of Ic's of composite superconductive wire-materials 10 with respect to the Ic of the thin-film superconductive wire-material 16 before achievement of solder immersion, were 20 at the immersion temperature of 90 seconds and 10% at the immersion time of 100 seconds, thereby exemplifying that longer immersion times exceeding 90 seconds resulted in worse degradation ratios. Meanwhile, there were also observed solder bonding states of the pieces of thin-film superconductive wire-material 16 and electroconductive tape 15, and external appearances of composite superconductive wire-materials 10, where the immersion temperatures of the pieces of thin-film superconductive wire-material 16 and electroconductive tape 15 in the solder bath 35 were 200° C. and 160° C. while changing immersion times from 1 second to 100 seconds. The manner for confirming solder bonding states was the same as Embodiment 1, and also the states marked "x" and "○" in Table 3 are the same as those in Embodiment 1. As listed in Table 3, solder adherences were undesirable when pieces of thin-film superconductive wire-material 16 and electroconductive tape 15 were immersed at immersion times of 1 second and 3 seconds, respectively, while adherences were made optimum at immersion times of 9 seconds and longer. Similarly, solder adherences were undesirable when pieces of thin-film superconductive wire-material 16 and electroconductive tape 15 were immersed at the immersion temperature of 160° C. and for immersion times of 3 seconds and shorter, while adherences were made optimum at immersion times of 15 seconds or longer. The manner for confirming external appearances of composite superconductive wire-materials 10 was the same as Embodiment 1, and also the states marked "x" and "○" in Table 3 are the same as those in Embodiment 1. As listed in Table 3, external appearances of composite superconductive wire-materials 10 were undesirable when pieces of thin-film superconductive wire-material 16 and electroconductive tape 15 were immersed at immersion times of 1 second and 3 seconds, respectively, while external appearances were excellent at immersion times of 9 seconds and longer.

Based on the results of Table 3, it can be said, for the optimum region of solder 36 of the present invention shown in FIG. 5, that the region represented by "immersion temperature≧(−10/3)×immersion time+210" is defined as the optimum region for the immersion times of 3 to 15 seconds, and the region represented by "immersion temperature≦(−4/3)× immersion time+280" is defined as the optimum region for the immersion times of 60 to 90 seconds. Further, as confirmed in Embodiment 2, the region of immersion temperatures of 160 to 200° C. is defined as a suitable region for immersion times of 15 to 60 seconds.

Embodiment 4

Next, there were observed solder bonding states of pieces of thin-film superconductive wire-material 16 and electro-

TABLE 3

| | Immersion time (sec) | | | | | | | | |
|---|---|---|---|---|---|---|---|---|---|
| | 1 | 3 | 5 | 9 | 15 | 60 | 75 | 80 | 90 |
| Ic (A) original | 100 | 100 | 100 | 100 | 100 | 100 | 100 | 100 | 100 |
| Ic after combination | 100 | 100 | 100 | 100 | 100 | 100 | 100 | 98 | 95 |
| Degradation ratio | 0 | 0 | 0 | 0 | 0 | 0 | 0 | 2% | 5% |
| Solder bonding state | X | X | X | ○ | ○ | ○ | ○ | ○ | ○ |
| External appearance | X | X | X | ○ | ○ | ○ | ○ | ○ | ○ | conductive tape 15, and critical currents (Ic), external appearances, and bendabilities of composite superconductive wire-materials 10, in using solder alloys of Sn and Bi having different compositions and solder alloys comprising Sn, Bi, and Ag as solder 36 as listed in Table 4. The results at this time are listed in Table 4. The immersion temperature of the solder bath 35 was set at 160° C. Note that the combining manner, conditions of combination, and configurations of the pieces of thin-film superconductive wire-material 16 and electroconductive tape were the same as those in Embodiment 1. Further, in this embodiment, feeding speeds of electroconductive tape and thin-film superconductive wire-material 16 were set at 1 m/min, respectively, and the immersion distance was set at 250 mm, thereby achieving an immersion time of 15 seconds.

TABLE 4

| Solder composition (wt %) | Liquid phase line temperature (° C.) | Solder bonding state | Critical current Ic (A) | External appearance | Bendability |
|---|---|---|---|---|---|
| Sn—40Bi | 180 | — | — | — | — |
| Sn—50Bi | 160 | X | 100 | X | X |
| Sn—55Bi | 149 | ○ | 100 | ○ | ○ |
| Sn—58Bi | 139 | ○ | 100 | ○ | ○ |
| Sn—60Bi | 150 | ○ | 100 | ○ | ○ |
| Sn—65Bi | 165 | — | — | — | — |
| Sn—57Bi—0.5Ag | 139 | ○ | 100 | ○ | ◎ |
| Sn—57Bi—1Ag | 139 | ○ | 100 | ○ | ◎ |
| Sn—56Bi—2Ag | 139 | ○ | 100 | ○ | X |

There were observed solder bonding states of pieces of thin-film superconductive wire-material 16 and electroconductive tape 15, and Ic's, external appearances, and bendabilities of composite superconductive wire-materials 10. The solder bonding states, Ic's, and external appearances were observed in the same manners as those in Embodiment 1, and states marked "x" and "○" in Table 2 indicate the same states as Embodiment 1. Further, for confirmation of bendabilities, composite superconductive wire-materials 10 were cyclically bent, in such a manner to achieve one cycle that: each composite superconductive wire-material 10 of 10 mm length was wound around a column having a diameter of 20 mm in a state that a superconductive layer 13 of the composite superconductive wire-material 10 was outwardly oriented; the composite superconductive wire-material 10 was returned to a straight state; the composite wire-material 10 was again wound around the column in a state that the superconductive layer 13 was oriented inwardly; and then the composite superconductive wire-material 10 was again returned to the straight state. In Table 4, states marked "x" indicate such states that the applicable electroconductive tape 15 and thin-film superconductive wire-material 16 were brought into a separated state by the number of bending times less than five; states marked "○" indicate such states that the applicable electroconductive tape 15 and thin-film superconductive wire-material 16 were not separated even by the number of bending times of ten or more; and states marked "◎" indicate such states that the applicable electroconductive tape 15 and thin-film superconductive wire-material 16 were not separated even by the number of bending times of fifty or more. Further, when solder compositions in case of lead-free solders comprising solder alloys including Sn and Bi as compositions for solders 36 in the solder bath 35 were changed as listed in Table 4, solder bonding states, external appearances, and bendabilities were all excellent without degradation of Ic in those cases that pieces of thin-film superconductive wire-material 16 and electroconductive tape 15 were immersed by using solders having compositions of Sn-55Bi, Sn-58Bi, and Sn-60Bi, respectively. However, the composition of Sn-50Bi resulted in undesirable solder bonding state, external appearance, and bendability, though the Ic was not deteriorated. Meanwhile, compositions of Sn-40Bi and Sn-65Bi were impracticable, because liquid phase line temperatures thereof were higher than 160° C. as the immersion temperature.

Moreover, when solder compositions in case of solder alloys comprising Sn, Bi, and Ag as compositions for solders 36 in the solder bath 35 were changed as listed in Table 4, solder bonding states, external appearances, and bendabilities were all excellent without degradation of Ic in those cases that pieces of thin-film superconductive wire-material 16 and electroconductive tape 15 were immersed by using solders having compositions of Sn-57Bi-0.5Ag and Sn-57Bi-1Ag, respectively, similarly to the cases of the solders comprising solder alloys of Sn and Bi. However, the composition of Sn-57Bi-2Ag resulted in undesirable bendability, though the solder bonding state and external appearance were both excellent without degradation of Ic. Note that, although only 57 wt % is indicated for Bi concerning compositions of solder alloys comprising Sn, Bi, and Ag when Ag is 0.5 to 1 wt % in Embodiment 2, composition ratios of Bi are sufficient insofar as within a range of 55 to 60 wt %, and composition ratios of Sn are to vary depending on total weights of Bi and Ag.

From the above, it was possible to obtain a composite superconductive wire-material 10 having a stable solder bonding state and an excellent external appearance without degradation of superconductive property (critical current), by using a lead-free solder as a solder 36, comprising at least Sn and Bi where the content of Bi was 55 to 60%. Further, addition of 0.5 to 1% of silver (Ag) into solders 36 allowed for obtainment of composite superconductive wire-materials 10 having improved mechanical characteristics (exhibiting smaller degrees of plastic deformations) even when cyclically bent.

INDUSTRIAL APPLICABILITY

Although the thin-film superconductive wire-materials of the present embodiments had Y-based superconductive layers made of YBCO, the present invention is not limited thereto and is applicable to RE-based thin-film superconductive wire-materials comprising one kind or two or more kinds of elements selected from Y, Nd, Sm, Eu, Gd, Dy, Ho, Er, Tm, Yb, and Lu. For electroconductive tapes, it is possible to use materials comprising substantially pure copper such as oxygen-free copper (JIS C1020), tough pitch copper (JIS C1110), and the like, to use other materials such as copper alloys comprising Cu including less than 1% of added Cr, Sn, Zn, Si, Mg, or the like, and to use aluminum or the like. Note that, when copper alloys are utilized, electron conductivities are lowered to 80% as compared to pure copper, but mechanical characteristics are made more excellent such that strengths against tensile shearing stress are increased to 1.2 to 2 times stronger.

The invention claimed is:

1. A manufacturing method of a composite superconductive wire-material, which comprises the steps of:
    preparing a composite superconductive wire-material comprising: a thin-film superconductive wire-material including: a substrate; a superconductive layer; and a stabilizing layer; arranged in this order;
    abutting the thin-film superconductive wire-material and an electroconductive tape to each other;
    immersing at least a part of an abutment area, the abutment area comprising the thin-film superconductive wire-material and the electroconductive tape abutted to each other, into a molten solder in a solder bath to bond the thin-film superconductive wire-material and the electroconductive tape to each other, thereby forming a composite superconductive wire-material bondedly formed by the solder; and
    transporting the composite superconductive wire-material to the outside of the solder bath; and
    that the solder is a lead-free solder comprising at least Sn and Bi,
    wherein at least the part of the abutment area is immersed into the solder at an immersion temperature between 160° C. and 200° C.; and the immersion temperature has a relationship with an immersion time, during which at least the part of the abutment area is immersed into the solder, as follows, $$\text{immersion temperature} \geq (-10/3) \times \text{immersion time} + 210, \text{ where } 3 \text{ sec} \leq \text{immersion time} \leq 15 \text{ sec, and}$$

$$\text{immersion temperature} \leq (-4/3) \times \text{immersion time} + 280, \text{ where } 60 \text{ sec} \leq \text{immersion time} \leq 90 \text{ sec.}$$

2. The manufacturing method of a composite superconductive wire-material of claim 1, wherein the solder includes Bi at a content rate of 55 to 60 wt %.

3. The manufacturing method of a composite superconductive wire-material of claim 2, wherein the solder includes 0.5 to 1 wt % of Ag.

* * * * *